(12) United States Patent
Tung et al.

(10) Patent No.: US 10,591,216 B2
(45) Date of Patent: Mar. 17, 2020

(54) SOLIDIFYING DEVICE

(71) Applicant: INDUSTRIAL TECHNOLOGY RESEARCH INSTITUTE, Hsinchu (TW)

(72) Inventors: Fu-Ching Tung, Hsinchu (TW); Muh-Wang Liang, Toufen (TW); Jung-Chen Chien, Zhubei (TW); Yi-Jiun Lin, Chiayi County (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 157 days.

(21) Appl. No.: 15/831,181

(22) Filed: Dec. 4, 2017

(65) Prior Publication Data

US 2019/0101333 A1    Apr. 4, 2019

(30) Foreign Application Priority Data

Oct. 2, 2017    (TW) .............................. 106134081 A

(51) Int. Cl.
*F27D 9/00*    (2006.01)
*F27D 11/12*    (2006.01)
(Continued)

(52) U.S. Cl.
CPC ................ *F27D 9/00* (2013.01); *F26B 17/00* (2013.01); *F27B 9/14* (2013.01); *F27B 9/3005* (2013.01);
(Continued)

(58) Field of Classification Search
CPC .......... F26B 17/00; F27B 9/14; F27B 9/3005; F27B 21/06; F27D 9/00; F27D 11/12; F27D 2009/0081; F27D 2019/0006
(Continued)

(56) References Cited

U.S. PATENT DOCUMENTS 5,273,911 A * 12/1993 Sasaki ................... C23C 14/568
136/244
6,123,247 A    9/2000 Shibo et al.
(Continued)

FOREIGN PATENT DOCUMENTS

CN    1490585 A    4/2004
CN    201463524 U    5/2010
(Continued)

OTHER PUBLICATIONS

Park et al. "Fast sintering of silver nanoparticle and flake layers by infrared module assistance in large area roll-to-roll gravure printing system" Scientific Reports, Oct. 7, 2016.
(Continued)

*Primary Examiner* — Grant Moubry
*Assistant Examiner* — Benjamin W Johnson
(74) *Attorney, Agent, or Firm* — Maschoff Brennan

(57) ABSTRACT

A solidifying device is for solidifying a substrate which includes a middle and two side portions. The thermostability of the middle portion is greater than that of the side portions. The solidifying device includes a housing, a heating member, a temperature control air-floating member and a conveyor. The housing defines a working space. The heating member is in the working space. The substrate has a heat receiving surface facing the heating member. The temperature control air-floating member is in the working space and below the heating member. The conveyor is for transporting the substrate into the working space and between the temperature control air-floating member and the heating member. The heating member is for providing heat to the substrate. The temperature control air-floating member is for supplying air towards the substrate to allow the substrate to float in the working space and form a high-temperature and two low-temperature areas.

20 Claims, 6 Drawing Sheets

(51) Int. Cl.
    *F27B 9/14*         (2006.01)
    *F27B 21/06*       (2006.01)
    *F27B 9/30*         (2006.01)
    *F26B 17/00*       (2006.01)
    *F27D 19/00*       (2006.01)

(52) U.S. Cl.
    CPC .............. *F27B 21/06* (2013.01); *F27D 11/12* (2013.01); *F27D 2009/0081* (2013.01); *F27D 2019/0006* (2013.01)

(58) Field of Classification Search
    USPC .......................................................... 432/77
    See application file for complete search history.

(56) References Cited

U.S. PATENT DOCUMENTS

| | | | |
|---|---|---|---|
| 6,936,793 B1 * | 8/2005 | Shiloh ................... | B23K 1/008 219/400 |
| 8,726,537 B2 | 5/2014 | Palander | |
| 2005/0076827 A1 | 4/2005 | Muhe | |
| 2005/0255249 A1 * | 11/2005 | Schlatterbeck .......... | B05D 1/36 427/372.2 |
| 2012/0124856 A1 | 5/2012 | Palander | |
| 2013/0130185 A1 | 5/2013 | Herlevi | |
| 2013/0130186 A1 | 5/2013 | Oikarinen | |

FOREIGN PATENT DOCUMENTS

| | | |
|---|---|---|
| CN | 102393139 A | 3/2012 |
| CN | 103109148 A | 5/2013 |
| CN | 103109149 B | 5/2013 |
| CN | 204388634 U | 6/2015 |
| CN | 104810309 A | 7/2015 |
| CN | 205784531 U | 12/2016 |
| CN | 205900574 U | 1/2017 |
| JP | 2001-147083 A | 5/2001 |
| TW | I259550 B | 8/2006 |
| TW | I301537 B | 10/2008 |
| TW | M481240 U | 7/2014 |
| TW | I513028 B | 2/2016 |
| TW | 201639186 A | 11/2016 |
| WO | 2013071830 A1 | 5/2013 |

OTHER PUBLICATIONS

Tobjork et al. "IR-sintering of ink-jet printed metalnanoparticles on paper" Thin Solid Films, p. 2949-2995, Oct. 10, 2011.
Harkema et al. "Large area ITO-free flexible white OLEDs with Orgacon PEDOT:PSS and printed metal shunting lines" Proceedings of SPIE—The International Society for Optical Engineering, Aug. 2009.
Hosel et al. "Large-scale roll-to-roll photonic sintering of flexo printed silver nanoparticle electrodes" Journal of Materials Chemistry, May 11, 2012.
Stanel et al. "Present status of Roll-to-Roll Fabrication for OLED lighting" Fraunhofer Institute for Organic Electronics, Electron Beam and PLasama Technology FEP, Jun. 2, 2016.
Cherrington et al. "Ultrafast near-infrared sintering of a slot-die coated nano-silver conducting ink" Journal of Materials Chemistry, 2011.
TW Office Action dated Mar. 14, 2018 as received in Application No. 106134081.

* cited by examiner

SOLIDIFYING DEVICE

CROSS-REFERENCE TO RELATED APPLICATIONS

This non-provisional application claims priority under 35 U.S.C. § 119(a) on Patent Application No(s). 106134081 filed in Taiwan, R.O.C. on Oct. 2, 2017, the entire contents of which are hereby incorporated by reference.

TECHNICAL FIELD

The disclosure relates to a solidifying device.

BACKGROUND

In the field of optoelectronic and semiconductor industries, it is a common manufacturing process to deposit thin film onto ceramic, plastic or glass substrates. Usually, a half-finished product of thin-film substrate would then be processed with a thermal control process, such as a heating process, so as to improve the quality of thin-film products.

The substrates, where thin films are deposited, may be formed of a single material or multiple materials. For example, a substrate is formed of one material for its middle portion and the other material for its two side portions, such that the thermostability of the middle portion is different from the thermostability of the side portions.

SUMMARY

The present disclosure provides a solidifying device.

One embodiment of the disclosure provides a solidifying device configured for solidifying a substrate. The substrate includes a middle portion and two side portions. The thermostability of the middle portion is greater than the thermostability of the side portions. The solidifying device includes a housing, a heating member, a temperature control air-floating member and a conveyor. The housing defines a working space. The heating member is disposed in the working space. The substrate has a heat receiving surface facing the heating member. The temperature control air-floating member is disposed in the working space. The heating member is located above the temperature control air-floating member. The conveyor is configured for carrying and transporting the substrate into the working space to position the substrate between the temperature control air-floating member and the heating member. The heating member is configured for providing heat to the substrate. The temperature control air-floating member is configured for supplying air towards the substrate in order to allow the substrate to float in the working space and form a high-temperature area and two low-temperature areas in the working space. The high-temperature area corresponds to the middle portion, and the two low-temperature areas respectively correspond to the two side portions.

One embodiment of the disclosure provides a solidifying device configured for solidifying a substrate. The substrate includes a middle portion and two side portions. The thermostability of the middle portion is greater than the thermostability of the side portions. The solidifying device includes a housing, a heating member, an air-floating member, a conveyor and at least one cooling member. The housing defines a working space. The heating member is disposed in the working space. The substrate has a heat receiving surface facing the heating member. The air-floating member is disposed in the working space. The heating member is located above the air-floating member. The conveyor is configured for carrying and transporting the substrate into the working space to position the substrate between the air-floating member and the heating member. The heating member is configured for providing heat to the substrate. The air-floating member is configured for supplying air towards the substrate in order to allow the substrate to float in the working space. The at least one cooling member is configured for providing a coolant for heat exchange to the side portions of the substrate to form a high-temperature area and two low-temperature areas in the working space. The high-temperature area corresponds to the middle portion, and the low-temperature areas respectively correspond to the side portions

BRIEF DESCRIPTION OF THE DRAWINGS

The present disclosure will become more fully understood from the detailed description given hereinbelow and the accompanying drawings which are given by way of illustration only and thus are not intending to limit the present disclosure and wherein.

DETAILED DESCRIPTION

Figure 1:
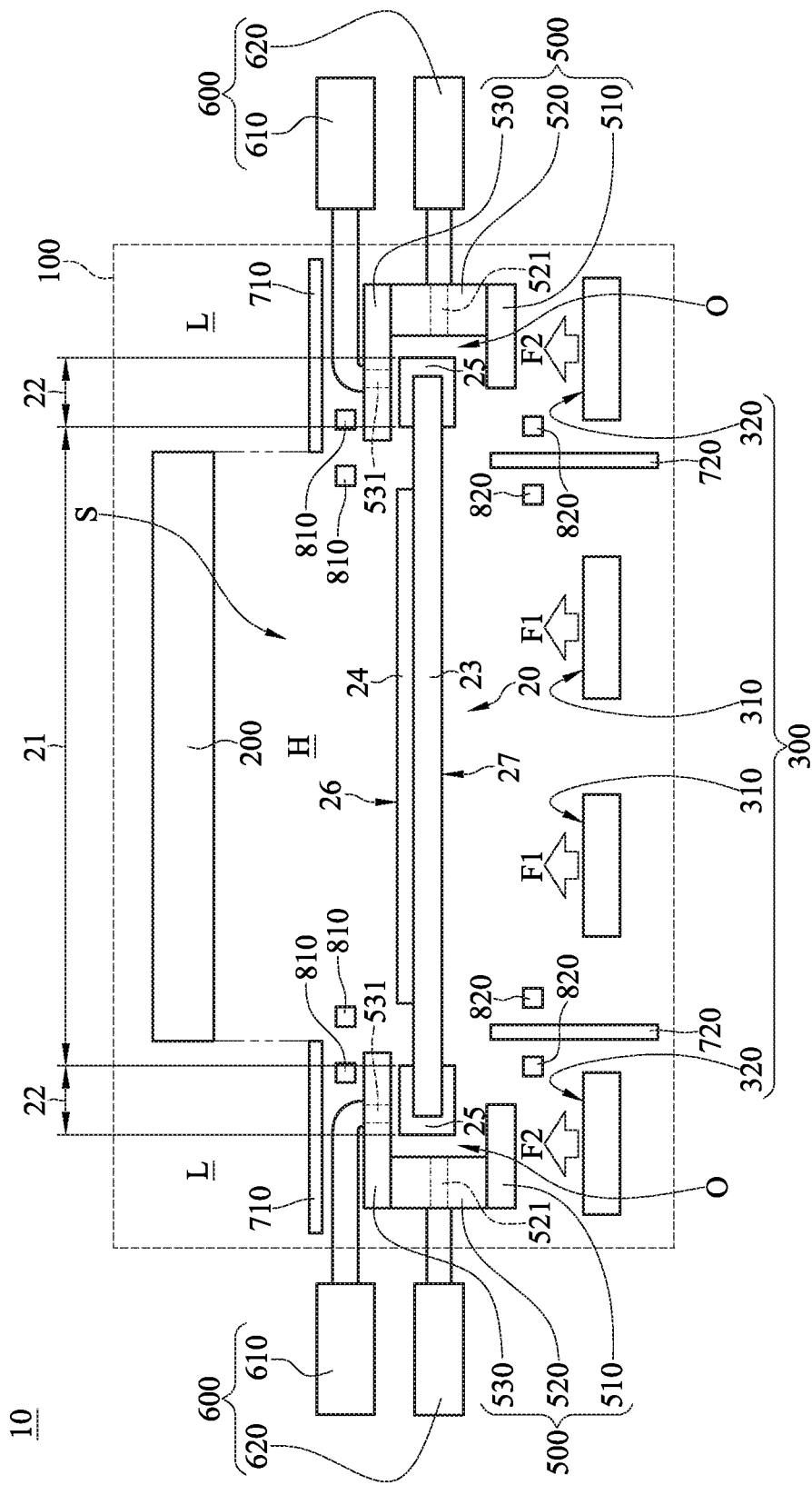
FIG. 1 is a plane view of a solidifying device in accordance with a first embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

The drawings may not be drawn to actual size or scale, some exaggerations may be necessary in order to emphasize basic structural relationships, while some are simplified for clarity of understanding, and the present disclosure is not limited thereto. It is allowed to have various adjustments under the spirit of the present disclosure. In the specification, the term "on" may be described as "one is located above another" or "one is in contact with another". In addition, the term "substantially" is referred to the complete or nearly complete extent or degree of a structure, which means that it is allowable to have tolerance during manufacturing.

Figure 2:
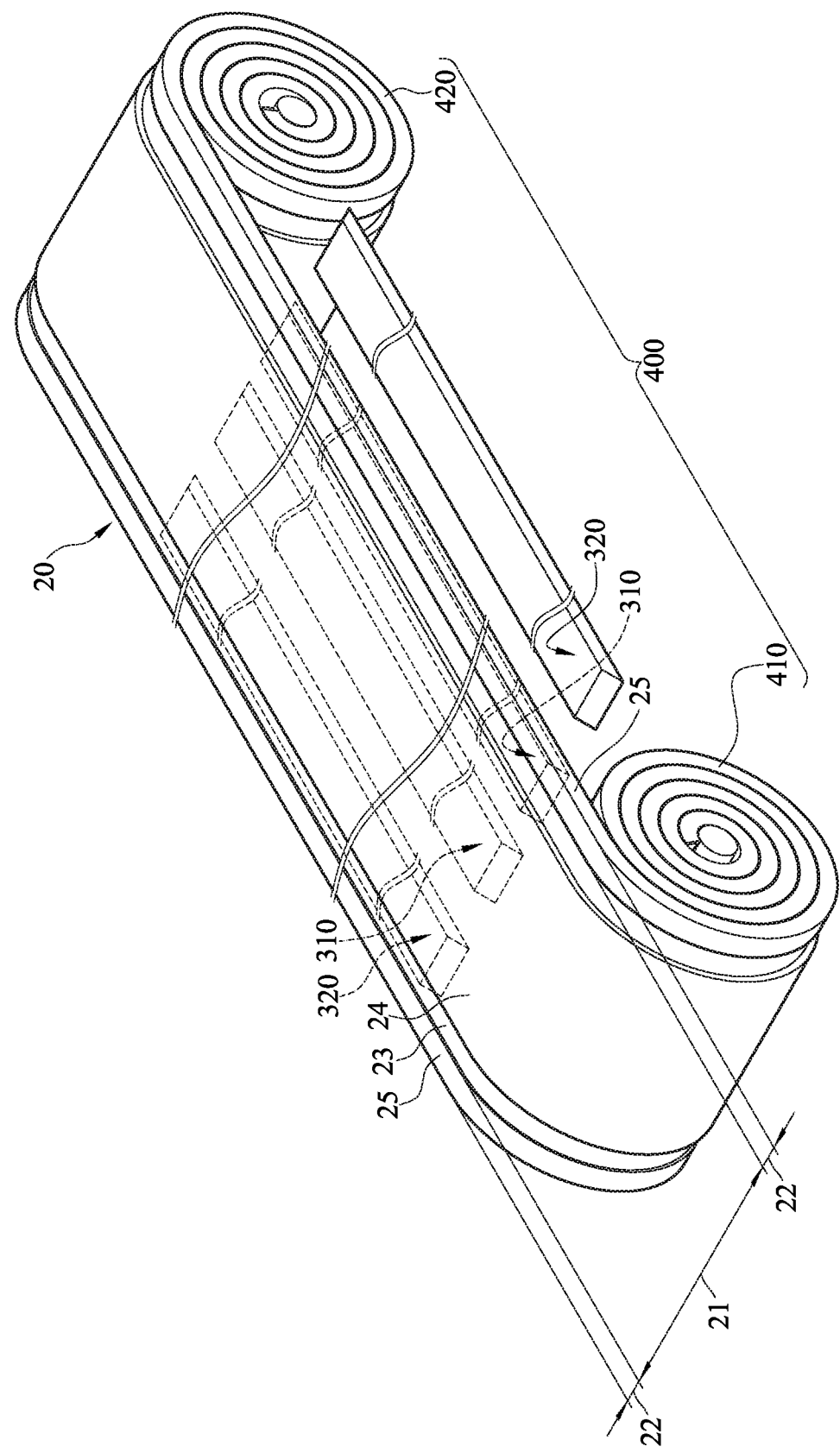
FIG. 2 is a perspective view of a substrate, a temperature control air-floating member and a conveyor in FIG. 1.
Figure 3:
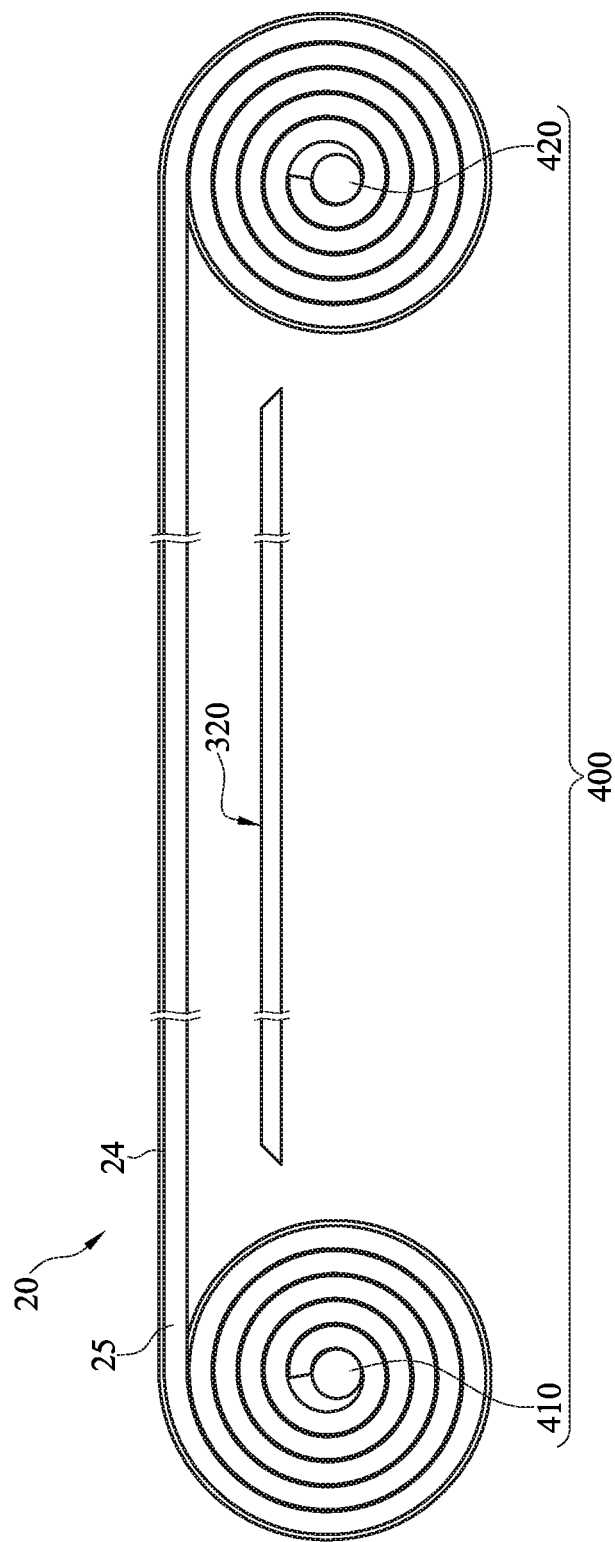
FIG. 3 is a side view of FIG. 2.

Please refer to FIG. 1 to FIG. 3. FIG. 1 is a plane view of a solidifying device in accordance with a first embodiment of the disclosure. FIG. 2 is a perspective view of a substrate, a temperature control air-floating member and a conveyor in FIG. 1. FIG. 3 is a side view of FIG. 2.

As shown in FIG. 1 to FIG. 3, a solidifying device 10 is provided. The solidifying device 10 is configured for solidifying a substrate 20. The substrate 20 includes a middle portion 21 and two side portions 22. The middle portion 21 is connected to the two side portions 22 on its two sides opposite to each other. The thermostability of the middle portion 21 is greater than the thermostability of the side portions 22. For example, the substrate 20 is a flexible substrate 23 (e.g., flexible glass) stacked with a thin film 24, and two sides of the flexible substrate 23 is wrapped with a flexible material 25 (e.g., PI tape or PE tape). The middle portion 21 is the middle area of the substrate 20 that is not wrapped with the flexible material 25, and the two side portions 22 are the two side areas of the substrate 20 that are wrapped with the flexible material 25. In this embodiment, the substrate 20 is formed in a belt-like shape and can be rolled around a roller, but the present disclosure is not limited thereto. In other embodiments, the substrate may be formed in other shapes, such as brick-like shape or panel-like shape.

The solidifying device 10 is, for example, a sintering device, which includes a housing 100, a heating member 200, a temperature control air-floating member 300 and a conveyor 400.

The housing 100 defining a working space S. The heating member 200 and the temperature control air-floating member 300 are disposed in the working space S, and the heating member 200 is located above the temperature control air-floating member 300. The conveyor 400 is, for example, a roll-to-roll system, which includes a roll-out member 410 and a roll-in member 420. The roll-out member 410 and the roll-in member 420 are, for example, rollers. The head part and the tail part of the substrate 20 are respectively wrapped around and stored on the roll-out member 410 and roll-in member 420. The roll-out member 410 and the roll-in member 420 transport the substrate 20 into the working space S to position the substrate 20 between the heating member 200 and the temperature control air-floating member 300. That is, the substrate 20 has a heat receiving surface 26 and a back surface 27 opposite to each other. The heat receiving surface 26 faces the heating member 200, and the back surface 27 faces the temperature control air-floating member 300.

In this embodiment, the heating member 200 is, for example, a heating lamp. When turned on, the heating member 200 provides heat into the working space S to raise the temperature therein so as to sinter the substrate 20. The temperature control air-floating member 300 blows air towards the back surface 27 of the substrate 20 in order to allow the substrate 20, which is located between the heating member 200 and the temperature control air-floating member 300, to float above the temperature control air-floating member 300.

In detail, in this embodiment, the temperature control air-floating member 300 includes two first outflow surfaces 310 and two second outflow surfaces 320. As shown in FIG. 1, a sum of the area of the first outflow surfaces 310 is greater than a sum of the area of the second outflow surfaces 320. The two first outflow surfaces 310 align with the middle portion 21 of the substrate 20, and the two second outflow surfaces 320 respectively align with the two side portions 22 of the substrate 20. The temperature of air flow F1 blown from the first outflow surface 310 is substantially equal to the heating temperature of the heating member 200, and the temperature of the air flow F1 is higher than or equal to the temperature of air flow F2 blown from the second outflow surfaces 320. A part of the working space S where the air flow F1 flows forms a high-temperature area H, and another part of the working space S where the air flows F2 flow forms two low-temperature areas L, wherein the high-temperature area H corresponds to the middle portion 21, and the two low-temperature areas L respectively correspond to the two side portions 22. In detail, the air flow F1 blown from the first outflow surfaces 310 is hot air in order to minimize the temperature difference between an upper side and a lower side of the substrate 20, thereby improving the quality of the solidifying process. The air flow F2 blown from the second outflow surfaces 320 is cold air in order to lower the temperature in the low-temperature areas L where the two side portions 22 of the substrate 20 are located, thereby lowering the risk that the side portions 22 of the substrate 20 easily deteriorate when being heated.

In this embodiment, the quantity of the first outflow surfaces 310 and the quantity of the second outflow surfaces 320 are both two, but the present disclosure is not limited thereto. In other embodiments, the quantity of the first outflow surface may be one, and the quantity of the second outflow surfaces may be more than three.

Furthermore, in this embodiment, the temperature of air flow blown from the first outflow surfaces 310 of the temperature control air-floating member 300 is different from the temperature of air flow blown from the second outflow surfaces 320 of the temperature control air-floating member 300, but the present disclosure is not limited thereto. In other embodiments, the temperature of air flow blown from the first outflow surfaces 310 may be the same as the temperature of air flow blown from the second outflow surfaces 320. Moreover, in some embodiments, an air-floating member having no temperature control function may be adapted in a solidifying device.

Figure 4:
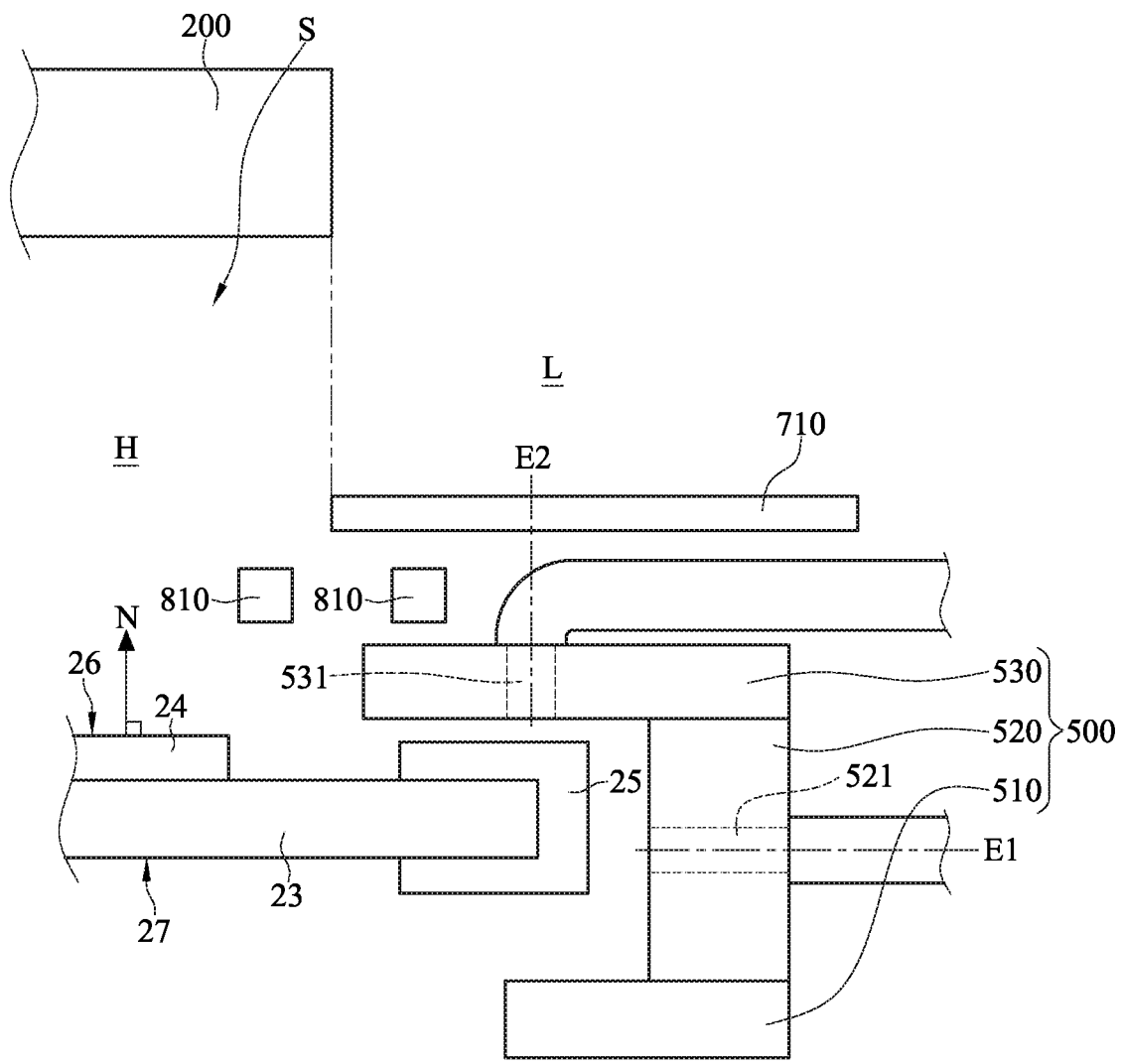
FIG. 4 is a partial enlarged view of FIG. 1.

Please refer to FIG. 1 and FIG. 4. FIG. 4 is a partial enlarged view of FIG. 1. In this embodiment and other embodiments, the solidifying device 10 further includes two movement-limiting members 500 and two cooling members 600. The two movement-limiting members 500 are respectively located on two sides of the working space S opposite to each other; that is, the two movement-limiting members 500 are respectively located in the two low-temperature areas L of the working space S. Each of the movement-limiting members 500 includes a bottom plate 510, a side plate 520 and a top plate 530. The top plate 530 is closer to the heating member 200 than the bottom plate 510 to the heating member 200. The top plate 530 and the bottom plate 510 are both connected to the side plate 520 and protrude from the side plate 520 towards the middle portion 21. The top plate 530, the bottom plate 510 and the side plate 520 together form a confining space O connected to the working space S. The two side portions 22 are adapted to be respectively disposed in the two confining spaces O. The movement-limiting members 500 are configured for confining the lateral movement of the substrate 20, and for the cooling members 600 to be disposed thereon. In detail, each of the two side plates 520 has an outflow channel 521, and a longitudinal axis E1 of the outflow channel 521 and a normal line N of the heat receiving surface 26 are orthogonal to each other. Each of the top plates 530 has an inflow channel 531, and a longitudinal axis E2 of the inflow channel 531 is parallel to the normal line N of the heat receiving surface 26. Each of the cooling members 600 includes a cooler 610 and a suction pump 620. The two coolers 610 are respectively connected to the two inflow channels 531, and the two suction pumps 620 are respectively connected to the two outflow channels 521. The coolers 610 are configured for providing a coolant into the confining space O, and the suction pumps 620 are configured for sucking the coolant out of the confining space O. Therefore, the two cooling members 600 are able to provide the coolants to the two side portions 22 of the substrate 20.

Please refer to FIG. 1 and FIG. 4, in this embodiment and other embodiments, the solidifying device 10 further includes two first heat insulating plates 710 and two second heat insulating plates 720. The two first heat insulating plates 710 are located between the heating member 200 and the two side portions 22 of the substrate 20, respectively. The two second heat insulating plates 720 are located in the gaps between the two first outflow surfaces 310 and the two second outflow surfaces 320, respectively. The first heat insulating plates 710 further prevent the heat provided by the heating member 200 from spreading into the low-temperature areas L. Similarly, the second heat insulating plates 720 further prevent the heat provided by the first outflow surfaces 310 from spreading into the low-temperature areas L.

Please refer to FIG. 1, in this embodiment and other embodiments, the solidifying device 10 further includes four first temperature sensors 810 and four second temperature sensors 820. The first temperature sensors 810 are respectively located in the high-temperature area H and the two low-temperature areas L between the substrate 20 and the heating member 200. The second temperature sensors 820 are respectively located in the high-temperature area H and the two low-temperature areas L between the substrate 20 and the temperature control air-floating member 300. The first temperature sensors 810 and the second temperature sensors 820 are configured for detecting the temperature in the high-temperature area H and low-temperature areas L, respectively, and transmitting the temperature data of the high-temperature area H and low-temperature areas L to a control unit (not shown in FIGs). Therefore, when the temperature in the high-temperature area H or the low-temperature areas L is higher or lower than a predetermined temperature, the control unit adjusts the heating temperature of the heating member 200, such as the temperature of air flow blown from the first outflow surfaces 310 of the temperature control air-floating member 300, the temperature of air flow blown from the second outflow surfaces 320 of the temperature control air-floating member 300, or the temperature of the coolants provided by the cooling members 600.

Figure 5:
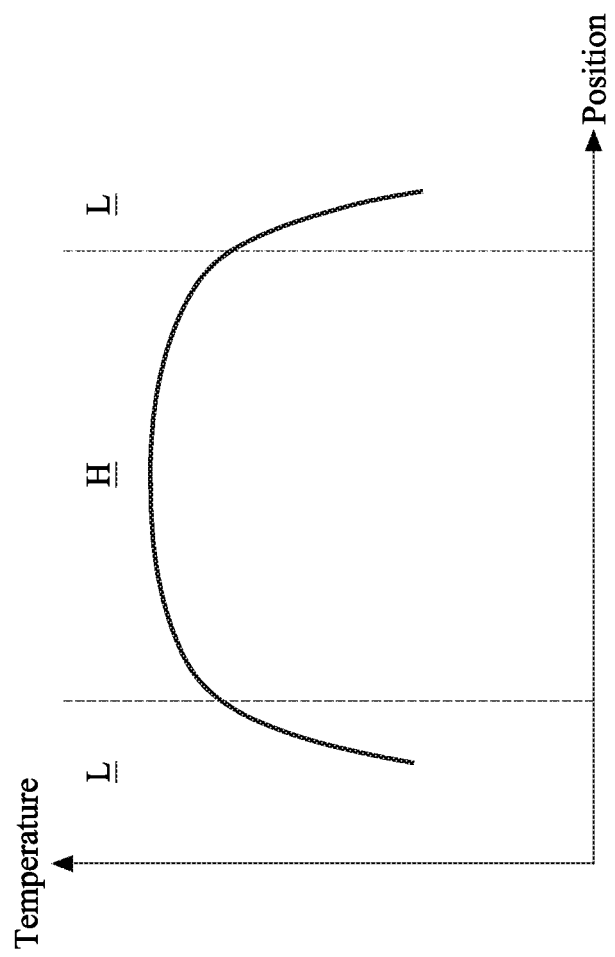
FIG. 5 is a temperature distribution curve of a high-temperature area and two low-temperature areas in FIG. 1.

Please refer to FIG. 1 and FIG. 5. FIG. 5 is a temperature distribution curve of the high-temperature area and the two low-temperature areas in FIG. 1.

In this embodiment, adjusting temperature by the heating member 200 with the temperature control air-floating member 300, or by the heating member 200 with the cooling members 600 is favorable for the temperature variation in the high-temperature area H of the working space S being relatively small, thereby maintaining the solidifying quality of the middle portion 21 having high thermostability in the high-temperature area H. On the other hand, the temperature variation is relatively large in the low-temperature areas L of the working space S (i.e., the temperature distribution curve in FIG. 5 corresponding to the low-temperature areas L is relatively steep), thereby lowering the risk that the side portions 22, which have low thermostability, easily deteriorate during a heating process.

Figure 6:
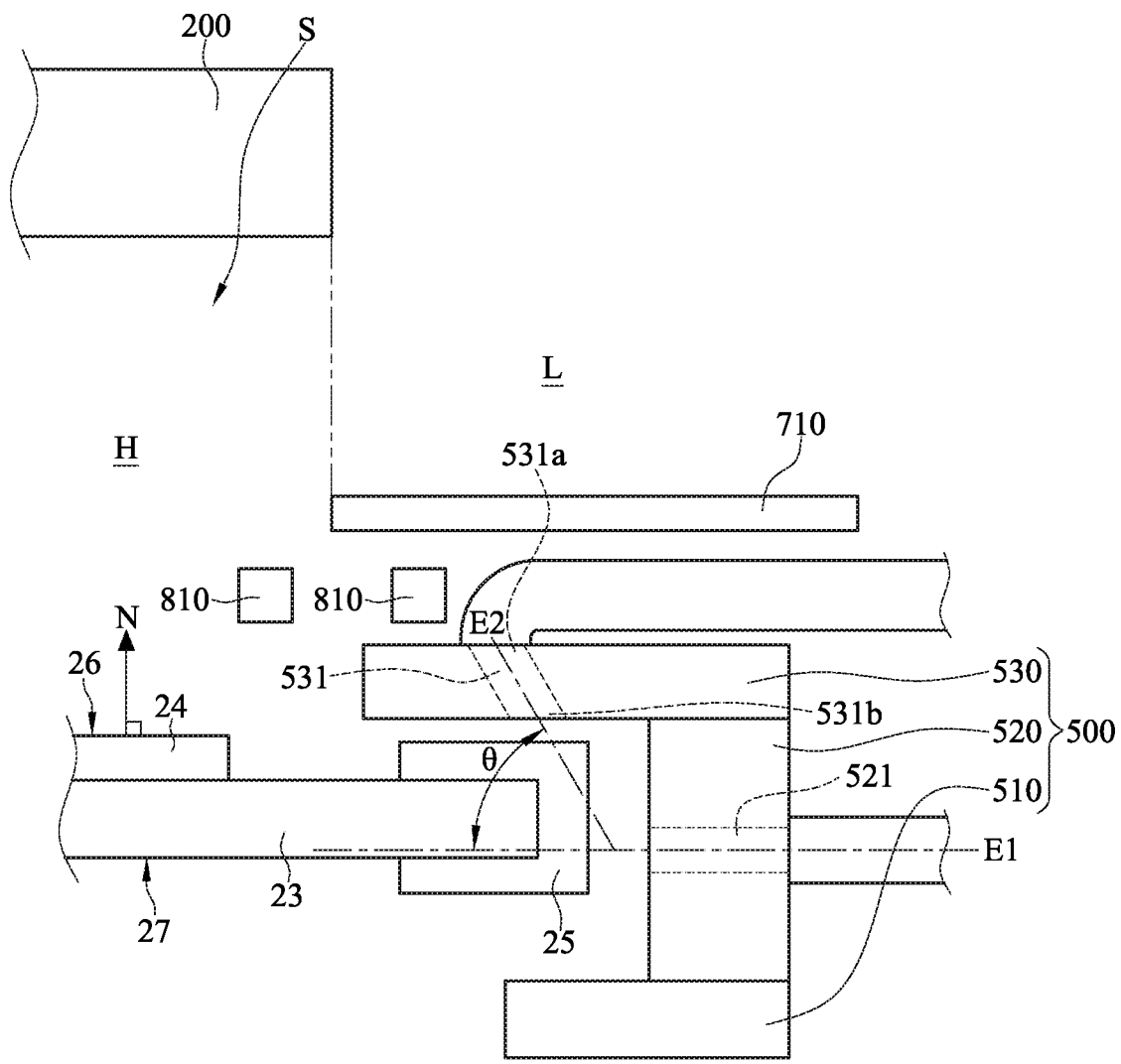
FIG. 6 is a partial enlarged view of a solidifying device in accordance with a second embodiment of the disclosure.

Please refer to FIG. 6, which is a partial enlarged view of a solidifying device in accordance with a second embodiment of the disclosure.

In this embodiment, an angle θ between a longitudinal axis E2 of each inflow channel 531 and a normal line N of the heat receiving surface 26 is an acute angle. In detail, for each movement-limiting member 500, the inflow channel 531 has a first end 531a and a second end 531b opposite to each other. The first end 531a is closer to the heating member 200 than the second end 531b to the heating member 200, and the first end 531a is farther away from the side plate 520 than the second end 531b to the side plate 520 in order to prevent the coolant from the inflow channel 531 flowing into the confining space O from affecting the solidifying quality in the high-temperature area H. Additionally, the angle θ is, for example, ranges from 0 to 30 degrees.

The embodiments were chosen and described in order to best explain the principles of the disclosure and its practical applications, to thereby enable others skilled in the art to best utilize the disclosure and various embodiments with various modifications as are suited to the particular use contemplated. It is intended that the scope of the disclosure be defined by the following claims and their equivalents.

What is claimed is:

1. A solidifying device, configured for solidifying a substrate, the substrate comprising a middle portion and two side portions, the thermostability of the middle portion being greater than the thermostability of the side portions, the solidifying device comprising:
a housing, defining a working space;
a heating member, disposed in the working space, the substrate having a heat receiving surface facing the heating member;
a temperature control air-floating member, disposed in the working space, the heating member being located above the temperature control air-floating member; and
a conveyor, configured for carrying and transporting the substrate into the working space to position the substrate between the temperature control air-floating member and the heating member, the heating member being configured for providing heat to the substrate, the temperature control air-floating member being configured for supplying air towards the substrate in order to allow the substrate to float in the working space and form a high-temperature area and two low-temperature areas in the working space, the high-temperature area corresponding to the middle portion, and the two low-temperature areas respectively corresponding to the two side portions.

2. The solidifying device according to claim 1, further comprising two cooling members corresponding to the side portions of the substrate, respectively, for providing a coolant into the two low-temperature areas.

3. The solidifying device according to claim 2, further comprising two movement-limiting members located on two sides of the working space opposite to each other, each of the movement-limiting members having at least one inflow channel and at least one outflow channel, each of the cooling members comprising a cooler and a suction pump, the cooler connected to the at least one inflow channel to provide the coolant for heat exchange to the side portions therethrough, the suction pump connected to the at least one outflow channel, and the suction pump being configured for sucking the coolant, which has performed heat exchange, from the side portions through the at least one outflow channel.

4. The solidifying device according to claim 3, wherein an angle between a longitudinal axis of the at least one inflow channel and a normal line of the heat receiving surface ranges substantially from 0 to 30 degrees.

5. The solidifying device according to claim 3, wherein a longitudinal axis of the at least one outflow channel and a normal line of the heat receiving surface are substantially orthogonal to each other.

6. The solidifying device according to claim 3, wherein each of the movement-limiting members comprises a bottom plate, a top plate and a side plate, the top plate is closer to the heating member than the bottom plate to the heating member, the top plate and the bottom plate are both connected to the side plate and protrude from the side plate towards the middle portion, the top plate, the bottom plate and the side plate together form a confining space connected to the working space, the two side portions of the substrate are adapted to be respectively disposed in the two confining spaces, the top plates respectively having the inflow channels, and the side plates respectively having the outflow channels.

7. The solidifying device according to claim 6, wherein each of the inflow channels has a first end and a second end opposite to each other, the first end is closer to the heating member than the second end to the heating member, and the first end is farther away from the side plate than the second end to the side plate.

8. The solidifying device according to claim 6, wherein the coolants flow into the working space through the inflow channels, the coolants in the working space flow through the side portions and then are pumped out of the confining space through the outflow channels.

9. The solidifying device according to claim 1, wherein the temperature control air-floating member comprises at least one first outflow surface and at least two second outflow surfaces, the at least one first outflow surface faces the middle portion of the substrate, the at least two second outflow surfaces face the two side portions of the substrate, respectively, and a sum of the area of the at least one first outflow surface is greater than a sum of the area of the at least two second outflow surfaces.

10. The solidifying device according to claim 9, wherein a temperature of air flow blown from the first outflow surface is substantially equal to a heating temperature of the heating member, and the temperature of air flow blown from the first outflow surface is higher than or equal to a temperature of air flow blown from the second outflow surfaces.

11. The solidifying device according to claim 1, further comprising two first heat insulating plates, located between the heating member and the two side portions of the substrate, respectively.

12. The solidifying device according to claim 9, further comprising two first heat insulating plates, located between the heating member and the two side portions of the substrate, respectively.

13. The solidifying device according to claim 12, further comprising two second heat insulating plates, located between the at least one first outflow surface and the at least two second outflow surfaces, respectively.

14. The solidifying device according to claim 1, further comprising a plurality of first temperature sensors and a plurality of second temperature sensors, the first temperature sensors located in the high-temperature area and the low-temperature areas between the substrate and the heating member, respectively; the second temperature sensors located in the high-temperature area and the low-temperature areas between the substrate and the temperature control air-floating member, respectively.

15. A solidifying device, configured for solidifying a substrate, the substrate comprising a middle portion and two side portions, the thermostability of the middle portion being greater than the thermostability of the side portions, the solidifying device comprising:
   a housing, defining a working space;
   a heating member, disposed in the working space, the substrate having a heat receiving surface facing the heating member;
   an air-floating member, disposed in the working space, the heating member being located above the air-floating member;
   a conveyor, configured for carrying and transporting the substrate into the working space to position the substrate between the air-floating member and the heating member, the heating member being configured for providing heat to the substrate, the air-floating member being configured for supplying air towards the substrate in order to allow the substrate to float in the working space; and
   at least one cooling member, configured for providing a coolant for heat exchange to the side portions of the substrate to form a high-temperature area and two low-temperature areas in the working space, the high-temperature area corresponding to the middle portion, and the low-temperature areas respectively corresponding to the side portions.

16. The solidifying device according to claim 15, further comprising two movement-limiting members, located on two sides of the working space opposite to each other, each of the movement-limiting members having at least one inflow channel and at least one outflow channel, the quantity of the at least one cooling member being two, each of the cooling members comprising a cooler and a suction pump, the cooler connected to the at least one inflow channel to provide the coolant for heat exchange to the side portions therethrough, the suction pump connected to the at least one outflow channel, and the suction pump being configured for sucking the coolant which has performed heat exchange from the side portions through the at least one outflow channel; and
   wherein the coolants flow into the working space through the inflow channels, the coolants in the working space flow through the side portions and then are pumped out of the working space through the outflow channels.

17. The solidifying device according to claim 16, wherein an angle between a longitudinal axis of the at least one inflow channel and a normal line of the heat receiving surface ranges substantially from 0 to 30 degrees.

18. The solidifying device according to claim 16, wherein a longitudinal axis of the at least one outflow channel and a normal line of the heat receiving surface are substantially orthogonal to each other.

19. The solidifying device according to claim 16, wherein each of the movement-limiting members comprises a bottom plate, a top plate and a side plate, the top plate is closer to the heating member than the bottom plate to the heating member, the top plate and the bottom plate are both connected to the side plate and protrude from the side plate towards the middle portion, the top plate, the bottom plate and the side plate together form a confining space connected to the working space, the two side portions of the substrate are adapted to be respectively disposed in the two confining spaces, the top plates respectively having the inflow channels, and the side plates respectively having the outflow channels.

20. The solidifying device according to claim 19, wherein each of the inflow channels has a first end and a second end opposite to each other, the first end is closer to the heating member than the second end to the heating member, and the first end is farther away from the side plate than the second end to the side plate.

\* \* \* \* \*